(12) United States Patent
Podell et al.

(10) Patent No.: US 8,704,611 B2
(45) Date of Patent: Apr. 22, 2014

(54) PLANAR CONSTANT-RESISTANCE HYBRID FILTER

(75) Inventors: Allen F. Podell, Palo Alto, CA (US);
Andrew Kearns, Danbury, CT (US);
Ky-Hien Do, Mississauga, CA (US)

(73) Assignee: Werlatone, Inc., Patterson, NY (US)

( * ) Notice: Subject to any disclaimer, the term of this patent is extended or adjusted under 35 U.S.C. 154(b) by 0 days.

(21) Appl. No.: 13/536,699

(22) Filed: Jun. 28, 2012

(65) Prior Publication Data
US 2014/0002210 A1    Jan. 2, 2014

(51) Int. Cl.
*H03H 7/46*    (2006.01)
*H03H 7/01*    (2006.01)

(52) U.S. Cl.
CPC ........................ *H03H 7/46* (2013.01)
USPC .......................................... 333/118; 333/185

(58) Field of Classification Search
CPC ............................... H03H 7/46; H03H 7/0115
USPC ......... 333/117, 118, 167, 168, 175, 185, 126, 333/132, 134
See application file for complete search history.

(56) References Cited

U.S. PATENT DOCUMENTS

| | | | |
|---|---|---|---|
| 2,115,138 A | 4/1938 | Darlinton | |
| 3,593,209 A | 7/1971 | Gittinger | |
| 3,775,703 A | 11/1973 | Smith | |
| 3,775,704 A | 11/1973 | Gittinger | |
| 3,781,718 A | 12/1973 | Gittinger | |
| 3,956,717 A | 5/1976 | Fisher et al. | |
| 7,592,883 B2* | 9/2009 | Shafer | 333/176 |
| 8,013,688 B2* | 9/2011 | White et al. | 333/134 |
| 2006/0197629 A1* | 9/2006 | Pivit et al. | 333/118 |

OTHER PUBLICATIONS

Mutual Inductance; http://www.electronics-tutorials.ws; Oct. 11, 2009.*
Breed, Gary; "Transmission Line and Lumped Element Quadrature Couplers"; From "High Frequency Electronics" Nov. 2009 and Copyright © 2009 Summit Technical Media, LLC; 3 pages.

* cited by examiner

*Primary Examiner* — Benny Lee
*Assistant Examiner* — Rakesh Patel
(74) *Attorney, Agent, or Firm* — Kolisch Hartwell, PC

(57) ABSTRACT

A hybrid filter may include sum, low-pass, high-pass, and intermediate nodes. A terminating impedance may couple the intermediate node to a circuit ground. A first low-pass network may couple the sum node to the low-pass node, and a first high-pass network may couple the sum node to the high-pass node. A second low-pass network may couple the high-pass node to the intermediate node. A second high-pass network may couple the low-pass node to the intermediate node. The second high-pass network may include the series connection of a first capacitor, a coupling network, and a second capacitor. The coupling network may include two coupling sections each with planar broadside-coupled first, second, and third conductor elements separated by dielectric layers. The first and third conductor elements in each section may be connected electrically in parallel.

21 Claims, 4 Drawing Sheets

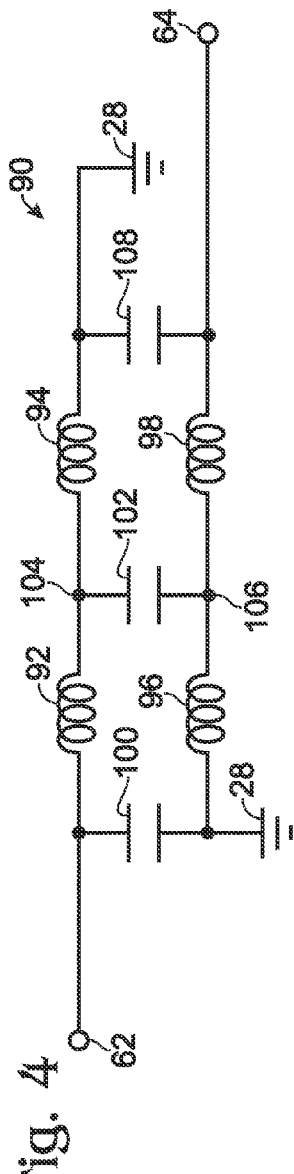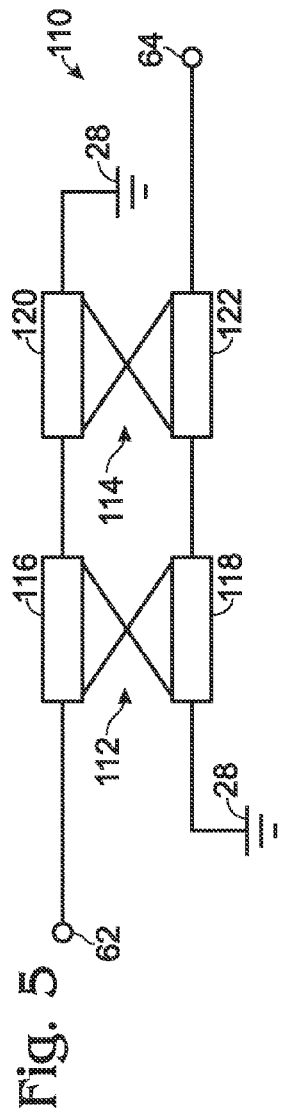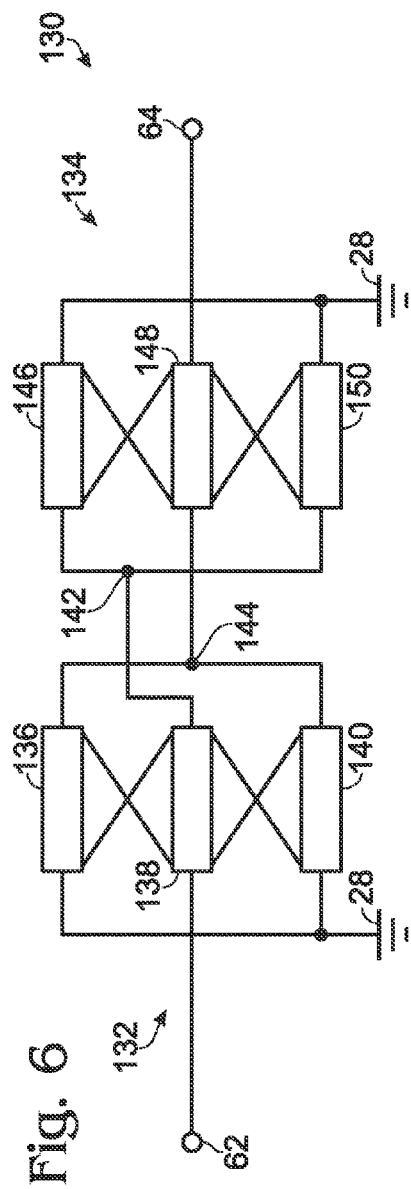

PLANAR CONSTANT-RESISTANCE HYBRID FILTER

BACKGROUND OF THE DISCLOSURE

A hybrid filter is a 3-port electronic device that has one sum port, one low-pass port and one high-pass port. Energies entering the sum port are directed to the other two ports based on the frequency characteristics of the signals being transported. Low-frequency signals are accordingly transported to the low-pass port, and high-frequency signals to the high-pass port. With these electrical properties, constant-resistance filters may be utilized in filtering applications and applications in which amplification of bi-directional signals travelling over a single transmission path is accomplished (i.e., repeaters).

In U.S. Pat. No. 2,115,138, S. Darlington described a wave transmission network, having a particular frequency selective property, which could be employed in a bi-directional repeater network to amplify signals—travelling in opposite directions along a single transmission path using—using only one amplifier. In U.S. Pat. No. 3,593,209, N. Gittinger described a hybrid filter having a frequency selective property, similar to Darlington's, which could be employed in a two-amplifier repeater node. Both of these patents employed two identical pairs of low-pass and high-pass T-networks in a bridge configuration, in conjunction with a phase inverting transformer, to form a collective wave transmission network or hybrid filter.

BRIEF SUMMARY OF THE DISCLOSURE

A hybrid filter may include sum, low-pass, high-pass, and intermediate nodes. A terminating impedance may couple the intermediate node to a circuit ground. A first low-pass network may couple the sum node to the low-pass node, and a first high-pass network may couple the sum node to the high-pass node. A second low-pass network may couple the high-pass node to the intermediate node. A second high-pass network may couple the low-pass node to the intermediate node. The second high-pass network may include the series connection of a first capacitor, a coupling network, and a second capacitor. The coupling network may provide both inductance and capacitance in series between the first and second capacitors.

The coupling network may include a first electromagnetic coupler section having at least first and second conductor elements that are electromagnetically coupled together, with the first conductor element connected between the first capacitor and circuit ground and the second conductor element connected between circuit ground and the second capacitor. The coupling network may further include a second electromagnetic coupler section having at least first and second conductor elements that are electromagnetically coupled together. The first conductor element of the second electromagnetic coupler section may be connected between the first conductor element of the first electromagnetic coupler section and circuit ground. The second conductor element of the second electromagnetic coupler section may be connected between the second conductor element of the first electromagnetic coupler section and the second capacitor.

In some examples, the first electromagnetic coupler section may further have a third conductor element that is electromagnetically coupled to the first conductor element of the first electromagnetic coupler section, and the second and third conductor elements of the first electromagnetic coupler section may be connected electrically in parallel. Similarly, The second electromagnetic coupler section may further have a third conductor element that is electromagnetically coupled to the second conductor element of the second electromagnetic coupler section. The first and third conductor elements of the second electromagnetic coupler section may be connected electrically in parallel.

In a further example, the first, second, and third conductor elements of the first electromagnetic coupler section may be disposed in parallel planes with the first conductor element of the first electromagnetic coupler section separated from each of the second and third conductor elements of the first electromagnetic coupler section by a respective dielectric layer. Similarly, the first, second, and third conductor elements of the second electromagnetic coupler section may be disposed in parallel planes with the second conductor element of the second electromagnetic coupler section separated from each of the first and third conductor elements of the second electromagnetic coupler section by a respective dielectric layer.

BRIEF DESCRIPTION OF THE DRAWINGS

FIGS. 2-6 are schematic diagrams of examples of coupled sections that may be used as the coupled section in the hybrid filter of FIG. 1.

DESCRIPTION OF EMBODIMENTS

Figure 1:
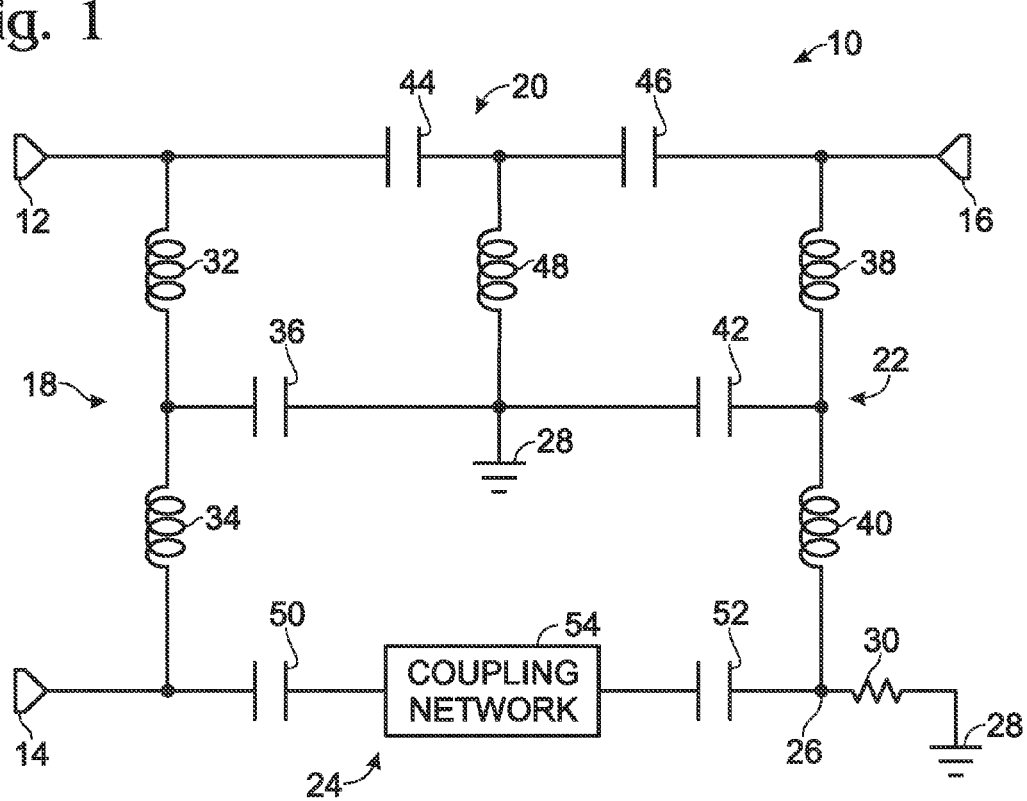
FIG. 1 is an example of a general circuit diagram showing a hybrid filter having a coupled section.

FIG. 1 shows an example of the general circuit diagram of a hybrid filter, shown generally at 10. The hybrid filter may be assembled to create an absorptive diplexer, or a part of an absorptive low-pass filter, or a part of an absorptive high-pass filter, over an extremely wide bandwidth.

Referring to FIG. 1, hybrid filter 10 may have three nodes also referred to as ports, including a sum port 12, a low-pass port 14, and a high-pass port 16. Sum port 12 may be connected to a low-pass network 18 and high-pass network 20. High-pass network 20 in turn may be connected to a second low-pass network 22. The junction node joining networks 20 and 22 may be referred to as high-pass port 16. Low-pass networks 18 and 22 may also be connected by another high-pass network 24. The junction node joining low-pass network 18 and high-pass network 24 may be referred to as low-pass port 14. The junction node joining low-pass network 22 and high-pass network 24 may be referred to as an intermediate node 26 that is terminated to a circuit ground 28 with resistor 30.

Low-pass network 18 may be a T-network, and may include inductors 32 and 34, shunted to ground 28 midway by a capacitor 36. Similarly, low-pass network 22 may be a T-network that includes inductors 38 and 40, shunted to ground midway by a capacitor 42.

High-pass network 20 also may be a T-network, and may include capacitors 44 and 46, shunted midway by an inductor 48. The impedances of the various networks and associated components may be selected to provide complimentary high and low pass bandwidths and may also provide constant impedance at each port over the associated bandwidths.

High-pass network 24 may include capacitors 50 and 52, and a coupling network 54. Coupling network 54 may provide both inductance and capacitance in series between capacitors 50 and 52. Five illustrative examples of coupling networks that may be used as coupling network 54 are shown in FIGS. 2-6. Other configurations will also be apparent to one skilled in the art.

Figure 2:
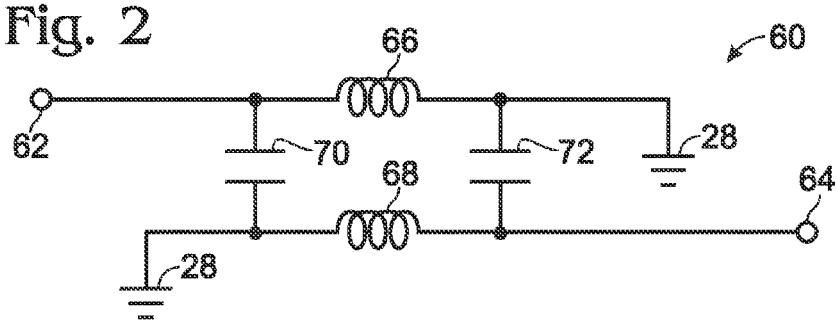

FIG. 2 illustrates a coupling network 60 extending between nodes 62 and 64 that may be directly connected to capacitors 50 and 52, respectively. Network 60 includes an inductor 66 coupling node 62 to circuit ground 28 and an inductor 68 coupling node 64 to circuit ground. A capacitor 70 also couples node 62 to circuit ground and a capacitor 72 couples node 64 to circuit ground.

Figure 3:
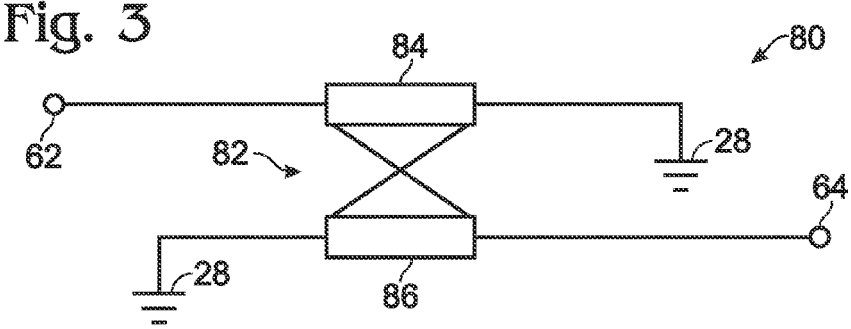

FIG. 3 illustrates a coupling network 80 that includes an electromagnetic coupler section 82 that extends between nodes 62 and 64. Electromagnetic coupler section 82 may have first and second conductor elements 84 and 86 that are electromagnetically coupled together. First conductor element 84 may be connected between the capacitor 50 via node 62 and circuit ground 28, and second conductor element 86 may be connected between circuit ground and capacitor 52 via node 64.

FIG. 4 illustrates a coupling network 90 that is similar to coupling network 60 with additional inductor and capacitor elements. In particular, network 90 includes the series connection of inductors 92 and 94 coupling node 62 to circuit ground 28 and the series connection of inductors 96 and 98 coupling node 64 to circuit ground 28. A capacitor 100 couples node 62 to circuit ground, a capacitor 102 couples a node 104 between inductors 92 and 94 to a node 106 between inductors 96 and 8, and a capacitor 108 couples node 64 to circuit ground.

FIG. 5 illustrates an extension of FIG. 3 as a coupling network 110. Coupling network 110 includes first and second electromagnetic coupler sections 112 and 114 connected between nodes 62 and 64. First electromagnetic coupler section 112 may have first and second conductor elements 116 and 118 that are electromagnetically coupled together. First conductor element 116 may be connected at one end to node 62 and second conductor element 118 may be connected at one end to circuit ground 28.

Second coupler section 114 may include third and fourth conductor elements 120 and 122 (being the first and second conductor elements of the second coupler section) that are electromagnetically coupled together. Third conductor element 120 may be connected between first conductor element 116 and circuit ground, and fourth conductor element 122 may be connected between second conductor element 118 of first electromagnetic coupler section 112 and the capacitor 52 via node 64.

FIG. 6 illustrates an extension of FIG. 5 as a coupling network 130. Coupling network 130 includes first and second electromagnetic coupler sections 132 and 134 connected between nodes 62 and 64. First electromagnetic coupler section 132 may have first and second conductor elements 136 and 138 that are electromagnetically coupled together and a third conductor element 140 that is electromagnetically coupled to second conductor element 138. One end of second conductor element 138 may be connected to node 62 and the other end may be connected to a junction node 142. First and third conductor elements 136 and 140 may be connected electrically in parallel and may be connected at one end to circuit ground 28 and the other end to a junction node 144.

Second electromagnetic coupler section 134 may have fourth and fifth conductor elements 146 and 148 that are electromagnetically coupled together and a sixth conductor element 150 that is electromagnetically coupled to fifth conductor element 148. It will be appreciated that conductor elements 146, 148, and 150 may also be referred to as the first, second, and third conductor elements of second coupler section 134. One end of fifth conductor element 148 may be connected to node 64 and the other end may be connected to junction node 144. Fourth and sixth conductor elements 146 and 150 may be connected electrically in parallel and may be connected at one end to circuit ground 28 and the other end to junction node 142.

Figure 7:
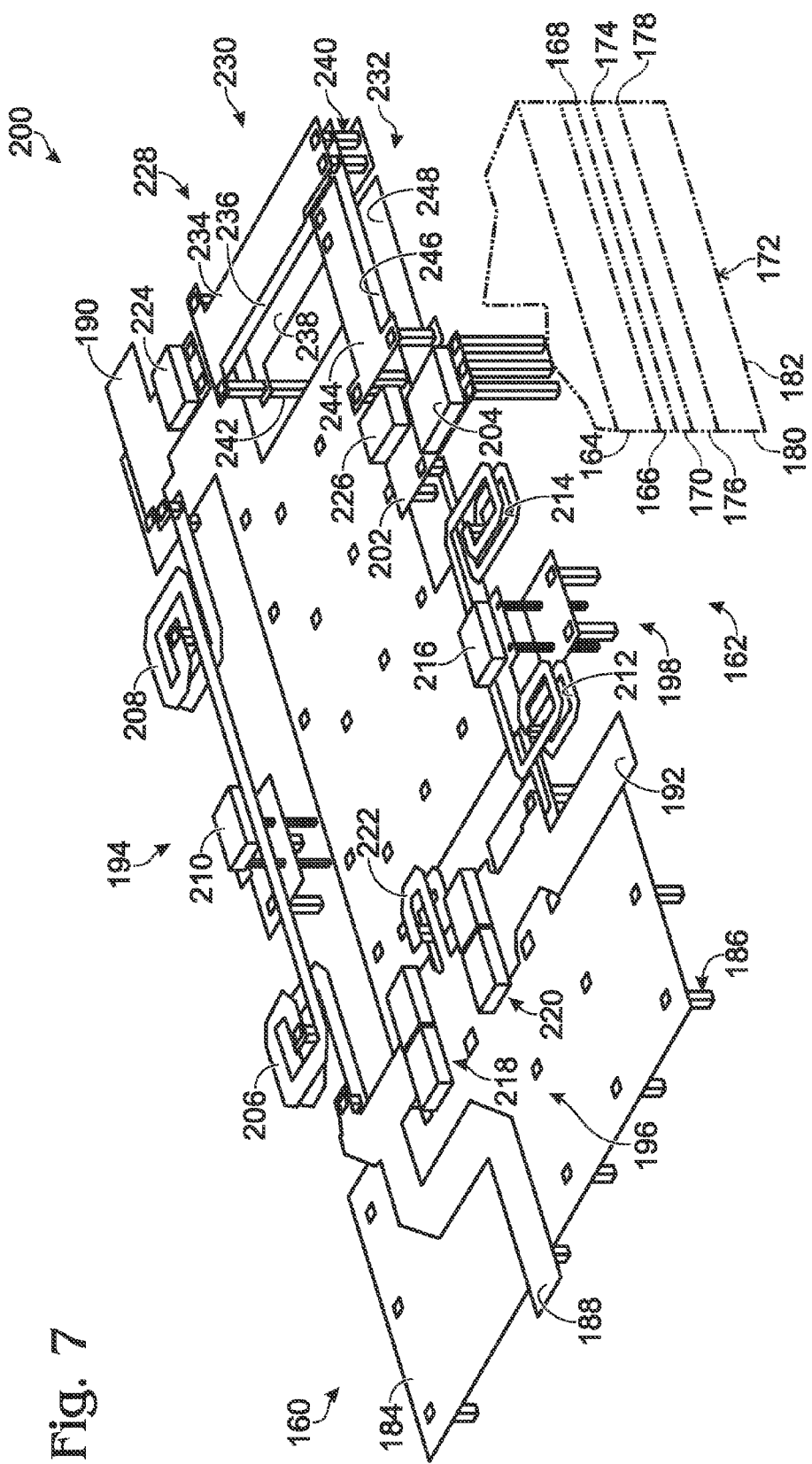
FIG. 7 is an isometric view of an exemplary planar embodiment of the hybrid filter of FIG. 1 having the coupled section of FIG. 6.

FIG. 7 illustrates an example of a constant-impedance hybrid filter 160 that is formed as a planar version of filter 10 of FIG. 1 having coupling network 130 of FIG. 6. Referencing the layers shown in FIG. 7, filter 160 is formed in a planar assembly 162 that includes, in order from the top to the bottom, a top dielectric layer 164, that may be air, a second dielectric layer 166 corresponding to the layer of surface-mount components to be described and which may otherwise also be air, a top metalization layer 168 formed on a third dielectric layer 170 forming a top dielectric layer of a printed circuit board (PCB) or motherboard 172. An intermediate metalization layer 174 formed between dielectric layer 170 and a fourth dielectric layer 176. A bottom metalization layer 178 is sandwiched between dielectric layer 176 and a fifth dielectric layer 180. Fifth dielectric layer 180 is formed on a ground plane 182 covering the bottom of motherboard 172. It will be appreciated that dielectric layers 170, 176, and 180 are made of one or more suitable rigid dielectric materials for supporting the metalization layers and surface-mount components in the configuration shown.

With this multi-layered assembly 162, the circuit of filter 160 is formed. As with filter 10, filter 160 includes a planar circuit ground 184 formed in the third metalization layer and connected to ground plane 182 by vias 186. Formed in metalization layers 168 and 174 are conductors forming and interconnecting components of the filter.

Filter 160 includes a sum port 188, a low-pass port 190, and a high-pass port 192. Sum port 188 is connected to a low-pass network 194 and high-pass network 196. High-pass network 196 in turn is connected to a second low-pass network 198. The junction node joining networks 196 and 198 is high-pass port 192. Low-pass networks 194 and 198 are also connected by another high-pass network 200. The junction node joining low-pass network 194 and high-pass network 200 is low-pass port 190. The junction node joining low-pass network 198 and high-pass network 200 is an intermediate node 202 that is terminated to circuit ground 184 with a surface-mount resistor 204.

Low-pass network 194 is a T-network that includes inductors 206 and 208, shunted to ground 184 midway by a surface mount capacitor 210. The inductors in filter 160 are coils formed on dielectric layers 166 and 170 interconnected by vias. Similarly, low-pass network 198 is a T-network that includes inductors 212 and 214 shunted to ground midway by a capacitor 216.

High-pass network 196, also a T-network, includes capacitors 218 and 220, shunted to ground midway by an inductor 222. Network 200 includes capacitors 224 and 226, and a coupling network 228.

Coupling network 228 includes first and second electromagnetic coupler sections 230 and 232 connected between capacitors 224 and 226. First electromagnetic coupler section 230 includes first, second, and third planar conductor elements 234, 236, and 238. First and second conductor elements 234 and 236 are broadside coupled together and second and third conductor elements 236 and 238 broadside coupled together. One end of second conductor element 236 is connected to capacitor 224. First and third conductor elements 234 and 238 are connected electrically in parallel by interconnecting vias, such as vias 240, and are connected to ground plane 182 by vias, such as vias 242.

Second electromagnetic coupler section 232 includes fourth and fifth broadside coupled conductor elements 244 and 246 and a sixth conductor element 248 that is broadside coupled to fifth conductor element 246. One end of fifth conductor element 246 is connected to capacitor 226 and the other end is connected to ends of conductor elements 234 and 238 of coupler section 230. Fourth and sixth conductor elements 244 and 248 are connected electrically in parallel and are connected at one end to ground plane 182 and the other ends to an end of second conductor element 236 of coupler section 230.

It will be appreciated that the first, second, and third conductor elements of the first electromagnetic coupler section are disposed in parallel planes with the first conductor element of the first electromagnetic coupler section separated from each of the second and third conductor elements of the first electromagnetic coupler section by a respective dielectric layer, and the first, second, and third conductor elements of the second electromagnetic coupler section are also disposed in parallel planes with the second conductor element of the second electromagnetic coupler section separated from each of the first and third conductor elements of the second electromagnetic coupler section by a respective dielectric layer.

In an example of planar constant-resistance hybrid filter 160, designed to provide a constant resistance response at all three ports from 10 MHz to 2000 MHz within a 50-ohm environment, inductors 206, 208, 212, and 214 may be assigned a value of about 25 nH, capacitors 218, 220, 224, and 226 about 4 pF, capacitors 210 and 216 about 11.8 pF, inductor 222 about 8.4 nH, the widths of conductor elements 234, 238, 244 and 248 of coupler sections 230 and 232 about 0.18 cm, the widths of conductor elements 236 and 246 of coupler sections 230 and 232 about 0.12 cm, the lengths of the conductor elements of coupler sections 230 and 232 about 1 cm, the thicknesses of dielectric layers 170 and 176 about 0.08 cm and 0.16 cm, respectively, and dielectric constants of dielectric layers 170, 176, and 180 forming motherboard 172 about 3.5.

Figure 8:
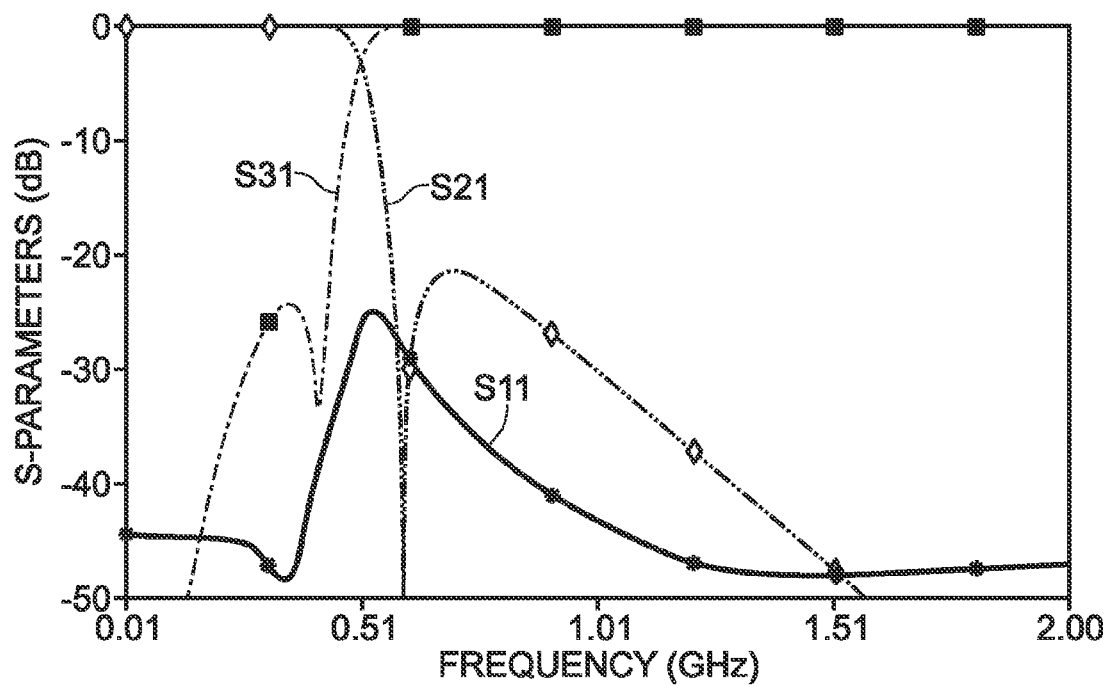
FIG. 8 is a chart illustrating representative performance, over a bandwidth of interest, for the hybrid filter shown in FIG. 7.

The electromagnetic simulated results of filter 160 may have the responses shown in FIG. 8. As can be seen, the return loss at sum port 188 (line S11) may exhibit a response well below −20 dB throughout the 10 MHz-2000 MHz range. Similarly, the return losses at ports 190 and 192 may exhibit a response (not shown) well below −20 dB, throughout the 10 MHz-2000 MHz range also. The transmission from port 188 to port 190 (S21) may exhibit a definitive low-pass response as desired. The transmission from port 188 to port 192 (S31) may exhibit a definitive high-pass response as desired. As a result it is seen that the filter exhibits low return losses at all three ports over a wide bandwidth that includes the low-frequency band, the cross-over band, and the high-frequency band.

In the Darlington patent, and in subsequent realizations of the constant-resistance filter, the inverting transformer has been a very difficult device to build in practice. In particular, for high power applications, wideband implementations have required ferrite loaded, large transformers that have added undesirable loss to the filter.

It will be appreciated that filters 10 and 160 may deploy a ferrite-less multi-conductor structure, along with two capacitors, to provide an impedance conjugacy condition for functioning of the bridge circuit formed by the interconnection of the high-pass and low-pass networks as described. Furthermore, filter 10 may be fully constructed on a planar multi-layer substrate, illustrated as filter 160, along with surface-mountable capacitors and inductors, to optimize insertion loss and heat-sinking requirements. Moreover, the multilayer substrate may be utilized to form printed inductors so as to further integrate the entire filter circuit for even better insertion loss, compact dimensions, better repeatability in high-volume production and high power-handling capability. Furthermore, with the use of the planar multi-conductor network, such as illustrated in FIGS. 6 and 7, the proposed ferrite-less planar constant-resistance hybrid filter may be assembled to handle power levels up to 500 W.

The above description is intended to be illustrative and not restrictive. Many other embodiments will be apparent to those skilled in the art, upon reviewing the above description. The scope of the intention should therefore be determined with reference to the appended claims, along with the full scope of equivalents to which such claims are entitled. Accordingly, while a embodiment of a planar constant-resistance hybrid filter have been particularly shown and described, many variations may be made therein. This disclosure may include one or more independent or interdependent inventions directed to various combinations of features, functions, elements and/or properties, one or more of which may be defined in the following claims. Other combinations and sub-combinations of features, functions, elements and/or properties may be claimed later in this or a related application. Such variations, whether they are directed to different combinations or directed to the same combinations, whether different, broader, narrower or equal in scope, are also regarded as included within the subject matter of the present disclosure.

An appreciation of the availability or significance of claims not presently claimed may not be presently realized. Accordingly, the foregoing embodiment is illustrative, and no single feature or element, or combination thereof, is essential to all possible combinations that may be claimed in this or a later application. Each claim defines an invention disclosed in the foregoing disclosure, but any one claim does not necessarily encompass all features or combinations that may be claimed. Where the claims recite "a" or "a first" element or the equivalent thereof, such claims include one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated. Ordinal indicators may be applied to associated elements in the order in which they are introduced in a given context, and the ordinal indicators for such elements may be different in different contexts.

What is claimed is:

1. A constant-resistance hybrid filter comprising:
    sum, low-pass, high-pass, and intermediate nodes;
    an impedance coupling the intermediate node to a circuit ground;
    a first low-pass network coupling the sum node to the low-pass node;
    a first high-pass network coupling the sum node to the high-pass node;
    a second low-pass network coupling the high-pass node to the intermediate node; and
    a second high-pass network coupling the low-pass node to the intermediate node, the second high-pass network including a first capacitor connected to the low-pass node, a second capacitor connected to the intermediate node, and a coupling network connecting the first capacitor to the second capacitor; the coupling network including a first electromagnetic coupler section comprising at least a first inductance electrically in series with the first capacitor and the second capacitor, a first capacitance coupling the first capacitor to circuit ground, and a second capacitance coupling the second capacitor to circuit ground.

2. The hybrid filter of claim 1, wherein the first inductance includes at least first and second conductor elements that are electromagnetically coupled together; the first conductor element being connected between the first capacitor and circuit ground; and the second conductor element being connected between circuit ground and the second capacitor.

3. The hybrid filter of claim 2, wherein the coupling network further includes a second electromagnetic coupler section having at least first and second conductor elements that are electromagnetically coupled together; the first conductor directly connecting the first capacitor to circuit ground through a series electrical connection of the first conductor elements of the first and second electromagnetic coupler sections; and the second conductor, directly connecting the second capacitor to circuit ground, through a series electrical connection of the second conductor elements of the first and second electromagnetic coupler sections.

4. The hybrid filter of claim 3, wherein the first electromagnetic coupler section further includes a third conductor element that is electromagnetically coupled to the first conductor element of the first electromagnetic coupler section; the second and third conductor elements of the first electromagnetic coupler section being connected electrically in parallel; and the second conductor including the third conductor element of the first electromagnetic coupler section.

5. The hybrid filter of claim 4, wherein the second electromagnetic coupler section further includes a third conductor element that is electromagnetically coupled to the second conductor element of the second electromagnetic coupler section; the first and third conductor elements of the second electromagnetic coupler section being connected electrically in parallel; and the first conductor including the third conductor element of the second electromagnetic coupler section.

6. The hybrid filter of claim 5, wherein the first, second, and third conductor elements of the first electromagnetic coupler section are disposed in parallel planes with the first conductor element of the first electromagnetic coupler section separated from each of the second and third conductor elements of the first electromagnetic coupler section by a respective dielectric layer, and the first, second, and third conductor elements of the second electromagnetic coupler section are disposed in parallel planes with the second conductor element of the second electromagnetic coupler section separated from each of the first and third conductor elements of the second electromagnetic coupler section by a respective dielectric layer.

7. The hybrid filter of claim 2, wherein the first and second conductor elements of the first electromagnetic coupler section are disposed in parallel planes separated by a dielectric layer.

8. The hybrid filter of claim 2, wherein the first electromagnetic coupler section further includes a third conductor element that is electromagnetically coupled to the first conductor element of the first electromagnetic coupler section; the second and third conductor elements of the first electromagnetic coupler section being connected electrically in parallel.

9. The hybrid filter of claim 8, wherein the first, second, and third conductor elements of the first electromagnetic coupler section are disposed in parallel planes with the first conductor element separated from each of the second and third conductor elements by a respective dielectric layer.

10. The hybrid filter of claim 1, wherein all signal paths in the second high-pass network extending between the first capacitor and the second capacitor include electromagnetic coupling.

11. The hybrid filter of claim 1, wherein each low-pass network includes two series low-pass inductors shunted to ground midway by a low-pass capacitor, and the first high-pass network includes two series high-pass capacitors shunted to ground midway by a high-pass inductor.

12. The hybrid filter of claim 11, wherein the first and second capacitors and the high-pass capacitors have the same capacitance values.

13. A constant-resistance hybrid filter comprising:
sum, low-pass, high-pass, and intermediate nodes;
an impedance coupling the intermediate node to a circuit ground;
a first low-pass network coupling the sum node to the low-pass node;
a first high-pass network coupling the sum node to the high-pass node;
a second low-pass network coupling the high-pass node to the intermediate node; and
a second high-pass network coupling the low-pass node to the intermediate node, the second high-pass network including a first capacitor connected to the low-pass node, a second capacitor connected to the intermediate node, and a coupling network connecting the first capacitor to the second capacitor; the coupling network including a first electromagnetic coupler section having at least first and second conductor elements that are electromagnetically coupled together, the first capacitor being directly connected to circuit ground by a first conductor including the first conductor element of the first electromagnetic coupler section, and the second capacitor being directly connected to circuit ground by a second conductor separate from the first conductor, the second conductor including the second conductor element of the first electromagnetic coupler section, wherein the coupling network includes a second electromagnetic coupler section having at least first and second conductor elements that are electromagnetically coupled together, the first conductor including a series electrical connection of the first conductor elements of the first and second electromagnetic coupler sections, and the second conductor including a series electrical connection of the second conductor elements of the first and second electromagnetic coupler sections.

14. The hybrid filter of claim 13, wherein the first electromagnetic coupler section further has a third conductor element that is electromagnetically coupled to the first conductor element of the first electromagnetic coupler section; the second and third conductor elements of the first electromagnetic coupler section being connected electrically in parallel; and the second conductor including the third conductor element of the first electromagnetic coupler section.

15. The hybrid filter of claim 14, wherein the second electromagnetic coupler section further has a third conductor element that is electromagnetically coupled to the second conductor element of the second electromagnetic coupler section; the first and third conductor elements of the second electromagnetic coupler section being connected electrically in parallel; and the first conductor including the third conductor element of the second electromagnetic coupler section.

16. The hybrid filter of claim 15, wherein the first, second, and third conductor elements of the first electromagnetic coupler section are disposed in parallel planes with the first conductor element of the first electromagnetic coupler section separated from each of the second and third conductor elements of the first electromagnetic coupler section by a respective dielectric layer; and the first, second, and third conductor elements of the second electromagnetic coupler section are disposed in parallel planes with the second conductor element of the second electromagnetic coupler section separated from each of the first and third conductor elements of the second electromagnetic coupler section by a respective dielectric layer.

17. A constant-resistance hybrid filter comprising:
sum, low-pass, high-pass, and intermediate nodes;
an impedance coupling the intermediate node to a circuit ground;
a first low-pass network coupling the sum node to the low-pass node;
a first high-pass network coupling the sum node to the high-pass node;
a second low-pass network coupling the high-pass node to the intermediate node; and
a second high-pass network coupling the low-pass node to the intermediate node, the second high-pass network including a first capacitor connected to the low-pass node, a second capacitor connected to the intermediate node, and a coupling network connecting the first capacitor and the second capacitor; the coupling network providing inductance in series with the first and second capacitors in a first electromagnetic coupler section having at least first and second conductor elements that are electromagnetically coupled together, a first conductor providing a continuous electric-charge-conducting electric-current path from the first capacitor to circuit ground, the first conductor including the first conductor element of the first electromagnetic coupler section; and a second conductor separate from the first conductor, the second conductor providing a continuous electric-charge-conducting electric-current path from the second capacitor to circuit ground, the second conductor including the second conductor element of the first electromagnetic coupler section.

18. The hybrid filter of claim 17, wherein the coupling network further includes a second electromagnetic coupler section having at least first and second conductor elements that are electromagnetically coupled together; the first conductor including a series electrical connection of the first conductor elements of the first and second electromagnetic coupler sections; and the second conductor including a series electrical connection of the second conductor elements of the first and second electromagnetic coupler sections.

19. The hybrid filter of claim 18, wherein the first electromagnetic coupler section further includes a third conductor element that is electromagnetically coupled to the first conductor element of the first electromagnetic coupler section; the second and third conductor elements of the first electromagnetic coupler section being connected electrically in parallel; and the second conductor including the third conductor element of the first electromagnetic coupler section.

20. The hybrid filter of claim 19, wherein the second electromagnetic coupler section further includes a third conductor element that is electromagnetically coupled to the second conductor element of the second electromagnetic coupler section; the first and third conductor elements of the second electromagnetic coupler section being connected electrically in parallel; and the first conductor including the third conductor element of the second electromagnetic coupler section.

21. The hybrid filter of claim 20, wherein the first, second, and third conductor elements of the first electromagnetic coupler section are disposed in parallel planes with the first conductor element of the first electromagnetic coupler section separated from each of the second and third conductor elements of the first electromagnetic coupler section by a respective dielectric layer; and the first, second, and third conductor elements of the second electromagnetic coupler section are disposed in parallel planes with the second conductor element of the second electromagnetic coupler section separated from each of the first and third conductor elements of the second electromagnetic coupler section by a respective dielectric layer.

* * * * *